(12) United States Patent
Yamashita

(10) Patent No.: US 7,981,218 B2
(45) Date of Patent: Jul. 19, 2011

(54) SUBSTRATE SUPPORTING MECHANISM AND SUBSTRATE PROCESSING APPARATUS

(75) Inventor: Jun Yamashita, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 637 days.

(21) Appl. No.: 11/690,425

(22) Filed: Mar. 23, 2007

(65) Prior Publication Data

US 2008/0066682 A1 Mar. 20, 2008

(30) Foreign Application Priority Data

Mar. 24, 2006 (JP) .................... 2006-083633

(51) Int. Cl.
| | |
|---|---|
| C23C 16/00 | (2006.01) |
| C23F 1/00 | (2006.01) |
| H01L 21/306 | (2006.01) |
| F27B 5/14 | (2006.01) |
| H05B 3/68 | (2006.01) |
| H05B 3/08 | (2006.01) |
| H05B 3/50 | (2006.01) |
| H05B 3/10 | (2006.01) |

(52) U.S. Cl. ............... 118/725; 156/345.52; 219/390; 219/444.1; 219/539; 219/541; 219/544; 219/548

(58) Field of Classification Search .............. 118/725; 156/345.52; 219/390, 444.1, 539, 541, 544, 219/548

See application file for complete search history.

(56) References Cited

U.S. PATENT DOCUMENTS

| | | | | |
|---|---|---|---|---|
| 6,534,751 | B2 * | 3/2003 | Uchiyama et al. | 219/444.1 |
| 6,768,084 | B2 * | 7/2004 | Liu et al. | 219/390 |
| 2002/0011478 | A1 * | 1/2002 | Ratliff et al. | 219/390 |
| 2008/0223524 | A1 | 9/2008 | Kasanami et al. | |

FOREIGN PATENT DOCUMENTS

| | | |
|---|---|---|
| JP | 7-272834 | 10/1995 |
| JP | 2005-302936 | 10/2005 |
| KR | 2005-0115940 | 12/2005 |
| WO | WO 2004/095560 A1 | 11/2004 |

* cited by examiner

Primary Examiner — Parviz Hassanzadeh
Assistant Examiner — Rakesh Dhingra
(74) Attorney, Agent, or Firm — Oblon, Spivak, McClelland, Maier & Neustadt, L.L.P.

(57) ABSTRACT

A substrate supporting mechanism includes a function for heating a substrate placed thereon in a process container of a substrate processing apparatus. The substrate supporting mechanism includes a worktable configured to place the substrate thereon and including a heating element made of silicon carbide and formed in a predetermined pattern; an electric feeder electrode configured to supply electricity to the heating element; and a partition member made of an electrically insulating material and interposed between portions adjacent to each other in the heating element formed in the predetermined pattern.

12 Claims, 3 Drawing Sheets

SUBSTRATE SUPPORTING MECHANISM AND SUBSTRATE PROCESSING APPARATUS

BACKGROUND OF THE INVENTION

1. Field of the Invention

The present invention relates to a substrate supporting mechanism including a function for heating a substrate, such as a semiconductor wafer, placed thereon in a process container of a substrate processing apparatus, such as a film formation apparatus. The present invention further relates to a substrate processing apparatus including the substrate supporting mechanism.

2. Description of the Related Art

In order to manufacture semiconductor devices, vacuum processes, such as a CVD film formation process, an oxidation process, and a nitridation process, are performed on a semiconductor wafer (which will be simply referred to as "wafer", hereinafter) treated as a target substrate. Where a process of this kind is performed as a single-substrate process, a substrate processing apparatus used for this purpose is provided with a substrate worktable disposed in a vacuum-sustainable chamber to place thereon a target substrate or wafer. The substrate worktable includes a heating mechanism to heat the target substrate or wafer to a predetermined temperature during the process.

As a substrate worktable including such a heating mechanism, there is proposed a ceramic heater that is high in resistance against corrosive gases and is also high in thermal efficiency (Jpn. Pat. Appln. KOKAI Publication No. 7-272834 and so forth). This ceramic heater includes a base body formed of an aluminum nitride sintered body and serving as a worktable for placing a target substrate thereon. The base body is provided with a heating element built therein and made of a refractory metal.

However, in recent years, it is required to perform a plasma process while maintaining a target substrate, such as a semiconductor wafer, at a very high temperature of about 800° C. Under such harsh conditions, the ceramic heater described above is unusable, because the aluminum nitride sintered body suffers physical damage and/or dielectric breakdown due to thermal distortion.

As a substrate worktable usable under a high temperature as described above, there is known a structure that includes a quartz base having an inner bore and a heating element formed of a silicon carbide sintered body and disposed in the inner bore (Jpn. Pat. Appln. KOKAI Publication No. 2005-302936). This structure can heat a target substrate to a high temperature of about 800° C. without causing the problem described above.

However, in order to attain such a high temperature, the heating element requires a very large electric current to be supplied. Further, the heating element is present in a chamber set in a vacuum state, and is densely disposed to have portions adjacent to each other in order to attain high process uniformity. Consequently, a problem arises such that electric discharge is easily caused by an electric field generated in a space containing the heating element. If electric discharge occurs on the heating element, it becomes difficult to stably perform a process. Further, particles may be generated and bring about contamination, by which it becomes difficult to perform the process in a clean state.

BRIEF SUMMARY OF THE INVENTION

An object of the present invention is to provide a substrate supporting mechanism that suffers no damage even in a process at a high temperature, and prevents electric discharge from occurring in a space containing a heating element inside a worktable.

Another object of the present invention is to provide a substrate processing apparatus using such a substrate supporting mechanism.

According to a first aspect of the present invention, there is provided a substrate supporting mechanism including a function for heating a substrate placed thereon in a process container of a substrate processing apparatus, the substrate supporting mechanism comprising: a worktable configured to place the substrate thereon and including a heating element made of silicon carbide and formed in a predetermined pattern; an electric feeder electrode configured to supply electricity to the heating element; and a partition member made of an electrically insulating material and interposed between portions adjacent to each other in the heating element formed in the predetermined pattern.

According to a second aspect of the present invention, there is provided a substrate supporting mechanism including a function for heating a substrate placed thereon in a process container of a substrate processing apparatus, the substrate supporting mechanism comprising: a worktable configured to place the substrate thereon and including a base body and a heating element made of silicon carbide and formed in a predetermined pattern on the base body; a support member that supports the worktable inside the chamber; an electric feeder electrode connected to the heating element from outside the chamber through the support member and configured to supply electricity to the heating element; and a partition member made of an electrically insulating material and interposed between portions adjacent to each other in the heating element formed in the predetermined pattern.

According to a third aspect of the present invention, there is provided a substrate processing apparatus comprising: a chamber configured to accommodate a substrate and sustain a vacuum therein; a substrate supporting mechanism disposed inside the chamber and including a function for heating the substrate placed thereon; and a process mechanism configured to perform a predetermined process on the substrate inside the chamber, wherein the substrate supporting mechanism comprises a worktable configured to place the substrate thereon and including a heating element made of silicon carbide and formed in a predetermined pattern, an electric feeder electrode configured to supply electricity to the heating element, and a partition member made of an electrically insulating material and interposed between portions adjacent to each other in the heating element formed in the predetermined pattern.

According to a fourth aspect of the present invention, there is provided a substrate processing apparatus comprising: a chamber configured to accommodate a substrate and sustain a vacuum therein; a substrate supporting mechanism disposed inside the chamber and including a function for heating the substrate placed thereon; and a process mechanism configured to perform a predetermined process on the substrate inside the chamber, wherein the substrate supporting mechanism comprises a worktable configured to place the substrate thereon and including a base body and a heating element made of silicon carbide and formed in a predetermined pattern on the base body, a support member that supports the worktable inside the chamber, an electric feeder electrode connected to the heating element from outside the chamber through the support member and configured to supply electricity to the heating element, and a partition member made of an electrically insulating material and interposed between portions adjacent to each other in the heating element formed in the predetermined pattern.

According to the present invention, since the partition member made of an electrically insulating material is interposed between portions adjacent to each other in the heating element formed in a predetermined pattern, abnormal electric discharge is very effectively prevented from occurring between these portions. Consequently, it is possible to suppress particle generation due to electric discharge, thereby realizing a clean process without contamination.

It may be arranged such that a cover is further disposed to cover at least an upper side of the heating element, and the partition member extends downward from a lower side of the cover. In this case, it is possible to prevent electric discharge from occurring on the upper side of the heating element.

DETAILED DESCRIPTION OF THE INVENTION

An embodiment of the present invention will now be described with reference to the accompanying drawings.

Figure 1:
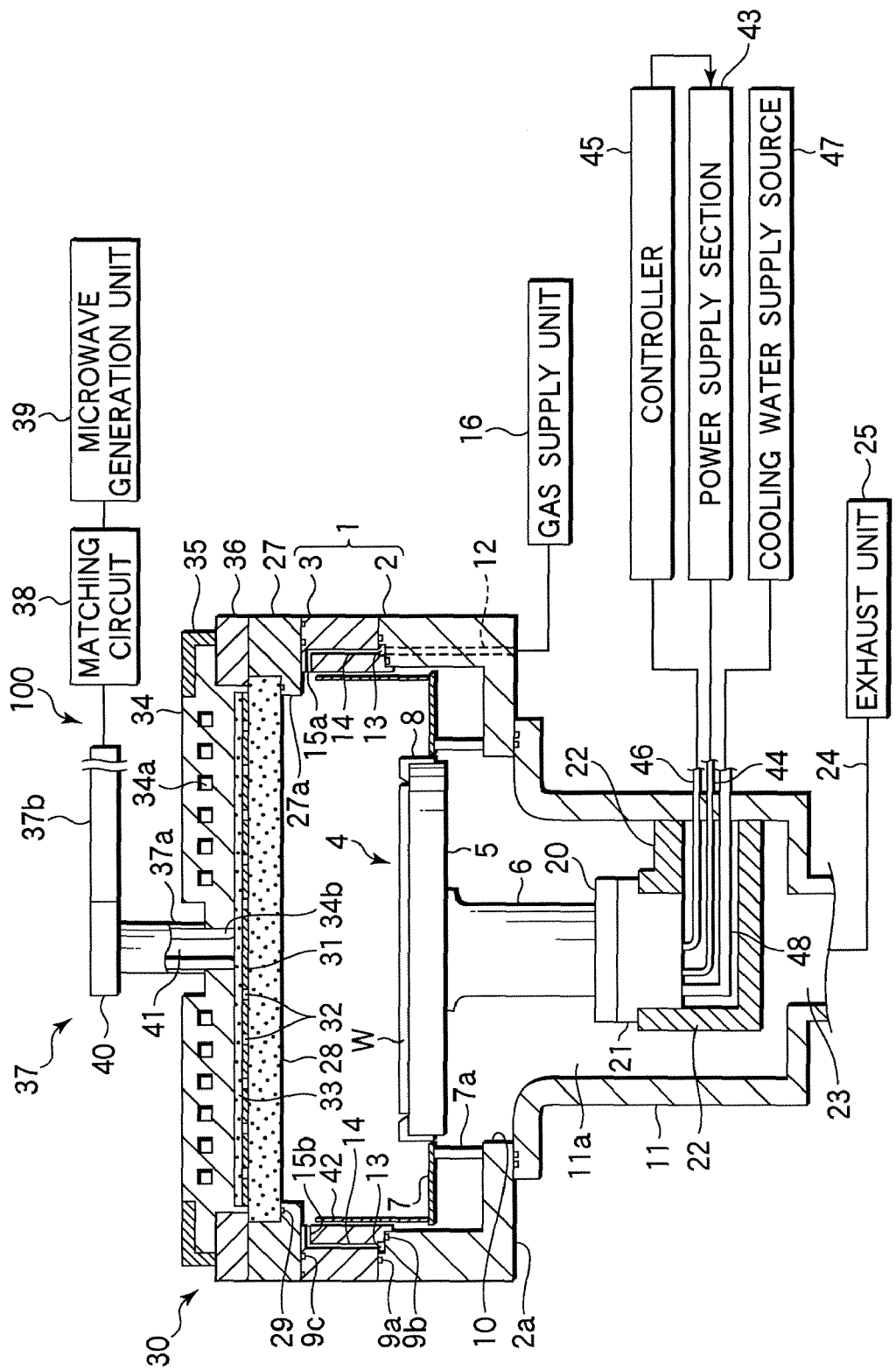
FIG. 1 is a sectional view schematically showing a plasma processing apparatus provided with a wafer supporting mechanism according to an embodiment of the present invention.

FIG. 1 is a sectional view schematically showing a plasma processing apparatus provided with a wafer supporting mechanism according to an embodiment of the present invention. This plasma processing apparatus 100 is arranged as a plasma processing apparatus, in which microwaves are supplied from a planar antenna having a plurality of slots, such as an RLSA (Radial Line Slot Antenna), into a process chamber to generate plasma, so that microwave plasma is generated with a high density and a low electron temperature.

The plasma processing apparatus 100 includes an airtight chamber (process container) 1 for accommodating a wafer W, wherein the chamber 1 is formed of an essentially circular cylinder and is grounded. The chamber 1 comprises a housing member 2 made of a metal, such as aluminum or stainless steel, and forming the lower part of the chamber 1, and a chamber wall 3 disposed on the housing member 2. The chamber 1 is provided with a microwave feed section 30 for supplying microwaves into the process space, wherein the section 30 is openable/closable.

The bottom wall 2a of the housing member 2 has a circular opening portion 10 formed essentially at the center. The bottom wall 2a is provided with an exhaust chamber 11 communicating with the opening portion 10 and extending downward to uniformly exhaust the interior of the chamber 1.

A wafer supporting mechanism 4 is located inside the housing member 2 to support a target substrate, such as a wafer W, in a horizontal state. The wafer supporting mechanism 4 includes a worktable 5 having a wafer support face and provided with a heating element as described later. The wafer supporting mechanism 4 further includes a cylindrical support member 6 extending upward from the bottom of the exhaust chamber 11 and supporting the center of the worktable 5. The bottom of the support member 6 is supported by a circular base plate 20 made of a metal, such as aluminum or aluminum alloy. A cylindrical base support member 21 made of a metal, such as aluminum or aluminum alloy, is further disposed below the base plate 20. The base support member 21 includes a connecting portion and a cooling portion. A fixing member 22 is attached to the sidewall of the exhaust chamber 11 to fix the worktable 5 by supporting the base support member 21 and to lead out connector wiring lines. Further, the worktable 5 is provided with a guide ring 8 located on the outer edge to guide the wafer W.

The outer periphery of the wafer supporting mechanism 4 is surrounded by an annular baffle plate 7 made of quartz, which is supported by a plurality of supports 7a. The baffle plate 7 allows the interior of the chamber 1 to be uniformly exhausted. A cylindrical liner 42 made of quartz is attached along the inner wall of the chamber 1 to prevent metal contamination due to the material of the chamber, thereby maintaining a clean environment. The liner 42 may be made of a ceramic (such as $Al_2O_3$, AlN, or $Y_2O_3$).

The exhaust chamber 11 has an exhaust port 23 formed at the bottom and connected to an exhaust unit 25 including a high speed vacuum pump through an exhaust line 24. The exhaust unit 25 can be operated to uniformly exhaust gas from inside the chamber 1 into the space 11a of the exhaust chamber 11, and then out of the exhaust chamber 11 through the exhaust port 23. Consequently, the inner pressure of the chamber 1 can be decreased at a high speed to a predetermined vacuum level, such as 0.133 Pa.

A power supply section 43 is located outside the chamber 1 to supply electricity to the heating element of the wafer worktable 5 and so forth. The heating element is supplied with power from the power supply section 43 through wiring lines 44. The power supply section 43 is connected to a controller 45, which controls the temperature of the worktable 5 by adjusting the power level of the power supply section 43 in accordance with data transmitted from a thermo couple through signal lines 46. Further, a cooling water supply source 47 is disposed to supply cooling water to a water-cooled member 21 through lines 48.

The housing member 2 has a transfer port formed in the sidewall and provided with a gate valve for opening/closing the transfer port (they are not shown), so that the wafer W is transferred therethrough. The upper end of the chamber wall 3 engages with the microwave feed section 30, while the lower end of the chamber wall 3 engages with the upper end of the housing 2.

Gas feed ports 15a are uniformly formed along the inner surface of the chamber wall 3 at a plurality of positions of the upper end (for example 32 positions). The gas feed ports 15a are connected to feed passages 15b extending therefrom in the horizontal direction. The gas feed passages 15b are connected to the gas passages 14 extending in the vertical direction in the chamber wall 3.

The gas passages 14 are connected to the annular passage 13 formed at the junction between the upper end of the housing member 2 and the lower end of the chamber wall 3. The annular passage 13 extends in an essentially horizontal annular direction to surround the process spacey. The annular passage 13 is connected to a gas supply unit 16 through passages 12 formed in the housing member 2 at certain positions (for example, at 4 positions uniformly separated) and extending in the vertical direction.

The chamber 1 has an opening portion at the top, which is airtightly closed by the microwave feed section 30. The microwave feed section 30 can be opened/closed by an opening/closing mechanism (not shown).

The microwave feed section 30 includes a transmission plate 28, a planar antenna member 31, and a wave-retardation body 33 laminated in this order from the susceptor 5 side. These members are covered with a shield member 34, a presser ring 36, and an upper plate 27, which are fixed by an annular retainer ring 35 having an L-shape in a cross section. When the microwave feed section 30 is closed, the portion between the upper end of the chamber 1 and the upper plate 27 is sealed by the seal member 9c, while the microwave feed section 30 is supported by the upper plate 27 through the transmission plate 28, as described later.

The transmission plate 28 is made of a dielectric body, such as quartz, sapphire or a ceramic, e.g., $Al_2O_3$, AlN, or SiN. The transmission plate 28 serves as a microwave introduction window for transmitting microwaves into the process space inside the chamber 1. The bottom surface of the transmission plate 28 (on the susceptor 5 side) is not limited to a flat shape, and, for example, a recess or groove may be formed therein to uniformized microwaves and thereby stabilize plasma. The transmission plate 28 is airtightly supported through a seal member 29 by an annular projecting portion 27a formed on the inner surface of the upper plate 27 below and around the microwave feed section 30. The portion between the lower end of the upper plate 27 and the upper end of the chamber 1 is sealed by the seal member 9c, so that the interior of the chamber 1 is kept airtight.

The planar antenna member 31 is formed of a circular plate and is fixed to the inner peripheral surface of the shield member 34 above the transmission plate 28. For example, the planar antenna member 31 is formed of, e.g., a copper plate or aluminum plate with the surface plated with gold or silver. The planar antenna member 31 has a number of slot holes 32 formed therethrough and arrayed in a predetermined pattern, for radiating electromagnetic waves, such as microwaves.

For example, the slot holes 32 are formed of long slits, wherein the slot holes 32 are typically arranged such that adjacent slot holes 32 form a T-shape, and T-shapes are arrayed on a plurality of concentric circles. The length and array intervals of the slot holes 32 are determined in accordance with the wavelength ($\lambda g$) of microwaves. For example, the intervals of the slot holes 32 are set to be $\frac{1}{4}\lambda g$, $\frac{1}{2}\lambda g$, or $\lambda g$. The slot holes 32 may have another shape, such a circular shape or arc shape. The array pattern of the slot holes 32 is not limited to a specific one, and, for example, it may be spiral or radial other than concentric.

The wave-retardation body 33 has a dielectric constant larger than that of vacuum, and is located on the top of the planar antenna member 31. For example, the wave-retardation plate 17 is made of quartz, a ceramic, a fluorocarbon resin, e.g., polytetrafluoroethylene, or a polyimide resin. The wave-retardation body 33 shortens the wavelength of microwaves to adjust plasma, because the wavelength of microwaves becomes longer in a vacuum condition. The planar antenna member 31 may be set in contact with or separated from the transmission plate 28. Similarly, the wave-retardation body 33 may be set in contact with or separated from the planar antenna 31.

The shield member 34 is formed of a conductive body serving as a wave guide tube, and is provided with cooling water passages 34a formed therein. Cooling water is supplied to flow through the cooling water passages 34a and thereby cool the shield member 34, wave-retardation body 33, planar antenna member 31, transmission plate 28. The shield member 34 is grounded.

The shield member 34 has an opening portion 34b formed at the center of the upper wall and connected to a wave guide tube 37. The wave guide tube 37 is connected to a microwave generation unit 39 at one end through a matching circuit 38. The microwave generation unit 39 generates microwaves with a frequency of, e.g., 2.45 GHz, which are transmitted through the wave guide tube 37 to the planar antenna member 31. The microwaves may have a frequency of 8.35 GHz or 1.98 GHz.

The wave guide tube 37 includes a coaxial wave guide tube 37a having a circular cross-section and extending upward from the opening portion 34b of the shield member 34, and a rectangular wave guide tube 37b connected to the upper end of the coaxial wave guide tube 37a through a mode transducer 40 and extending in a horizontal direction. Microwaves are propagated in a TE mode through the rectangular wave guide tube 37b, and are then transduced into a TEM mode by the mode transducer 40 interposed between the rectangular wave guide tube 37b and coaxial wave guide tube 37a. The coaxial wave guide tube 37a includes an inner conductive body 41 extending at the center, which is connected and fixed to the center of the planar antenna member 31 at the lower end. Consequently, microwaves are efficiently propagated from the inner conductive body 41 of the coaxial wave guide tube 37a in the radial direction to the planar antenna member 31.

Figure 2:
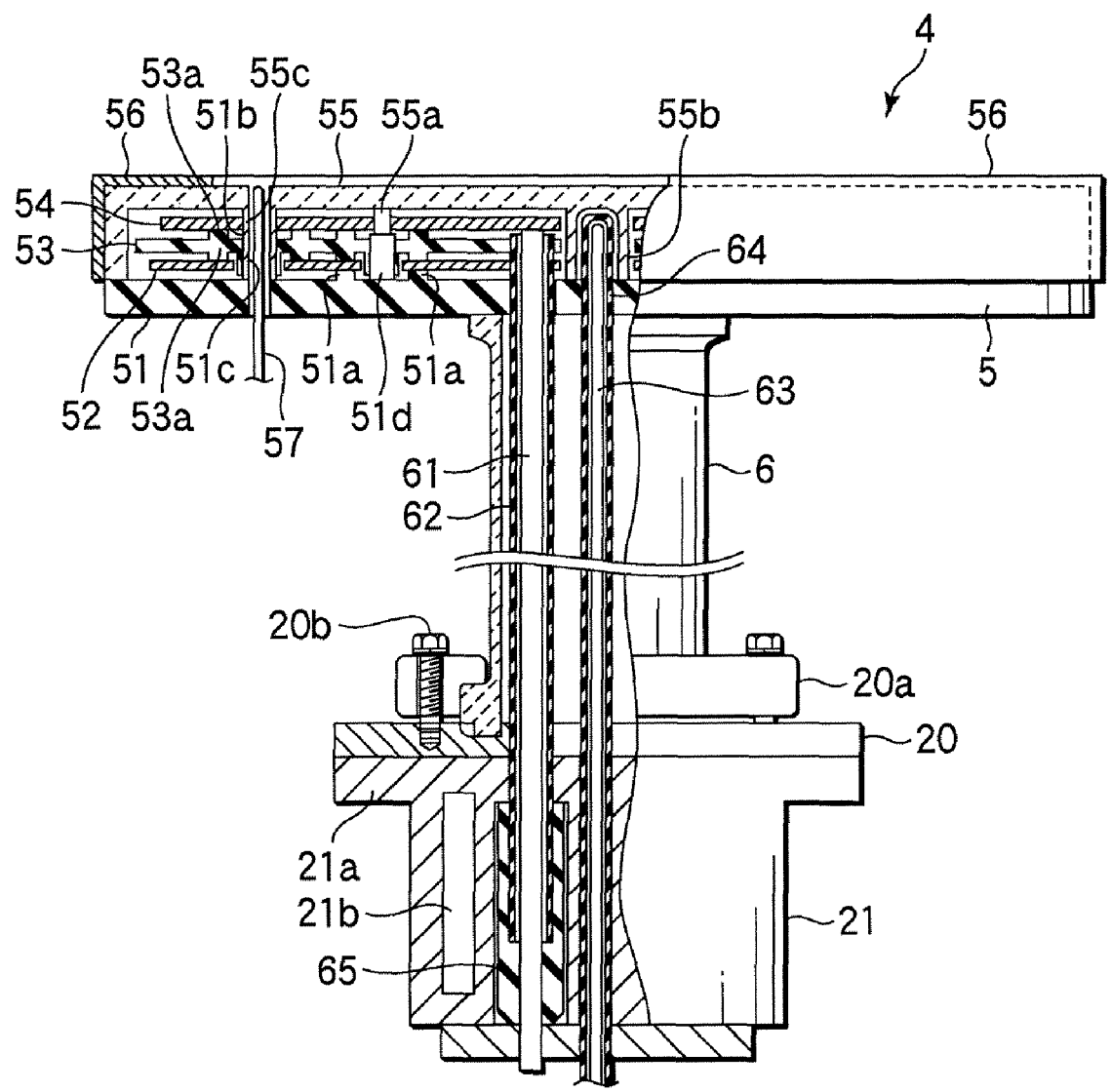
FIG. 2 is an enlarged sectional view showing the wafer supporting mechanism according to the embodiment of the present invention.

Next, a detailed explanation will be given of the wafer supporting mechanism 4 with reference the enlarged sectional view shown in FIG. 2.

As described above, the wafer supporting mechanism 4 includes the worktable 5 and the cylindrical support member 62 supporting the worktable 5. The worktable 5 comprises a quartz base member 51, on which a silicon reflector 52, an electrically insulating plate 53 made of quartz, and a heating element 54 made of silicon carbide (SiC) are stacked in this order and are covered from above with a transparent quartz cover 55. The base member 51 and insulating plate 53 are preferably made of opaque quartz. Further, the cover 55 is provided with a silicon reflector 56 formed on the side surface thereof and the portion thereof other than the support face for the wafer W. Since silicon reflects light having a wavelength of 1.2 μm or less, heat rays emitted from the heating element 54 made of silicon carbide are effectively reflected by the reflector 56, and the wafer W is thereby efficiently heated.

The base member 51 has projecting portions 51a extending upward, by which the reflector 52 is supported while being separated from the base member 51. The insulating plate 53 has projecting portions 53a extending upward and downward, by which gaps are respectively formed between the insulating plate 53 and reflector 52 and between the insulating plate 53 and heating element 54. Hollow pieces 51d each having an inner hole are disposed on the base member 51 and extend upward. The cover 55 has column-shaped insert portions 55a extending downward from the bottom and inserted in the hollow pieces 51d from above, so that reflector 52, insulating plate 53, and heating element 54 are fixed by the cover 55. FIG. 2 shows only one hollow piece 51d, but a plurality of (three or more) hollow pieces 51d are disposed, actually. The worktable 5 is provided with lifter pins 57 that can project and retreat relative to the worktable 5 to move the wafer W up and down. The cover 55 has projecting portions 55c extending downward at positions corresponding to the lifter pins 57. Lifter pin insertion holes 51c are formed through the worktable 5 at positions corresponding to the projecting portions 55c. FIG. 2 shows only one lifter pin 57, but three or more lifter pins 57 are disposed, actually.

The support member 6 is formed of a cylindrical transparent quartz member, which is integrated with the worktable 5 and extends downward from the center of the bottom of the worktable 5. The lower end of the support member 6 is attached to the base plate 20 by a ring-like attaching member 20a and screws 20b. The support member 6 envelops four electric feeder electrodes 61 (only one of them is shown) extending in the vertical direction and each formed of a silicon carbide (SiC) rod. The electric feeder electrodes 61 are connected at their upper ends to terminals of the heating element 54, and are respectively inserted in quartz tubes 62. Further, the support member 6 envelops a thermo couple 63 extending in the vertical direction from the center of an upper portion inside the worktable 5. The thermo couple 63 is inserted in a quartz tube 64, while the upper end of the quartz tube 64 is inserted in a thermo couple receptor 55b formed at the center of the bottom of the cover 55 and extending downward.

The electric feeder electrodes 61 and thermo couple 63 penetrate the base plate 20 and base support member 21 and extend downward. In the base support member 21, the electric feeder electrodes 61 are respectively guided by insulating members 65 for insulating them from the base support member 21. The insulating members 65 are made of, e.g., alumina or quartz. The electric feeder electrodes 61 and insulating members 65 are sealed by a seal ring (not shown).

The base support member 21 has a flange 21a at the upper end, and is fixed to the base plate 20 by screws through the flange 21a. The base support member 21 is provided with an annular water passage 21b formed therein for circulating cooling water to cool the base support member 21.

Figure 3:
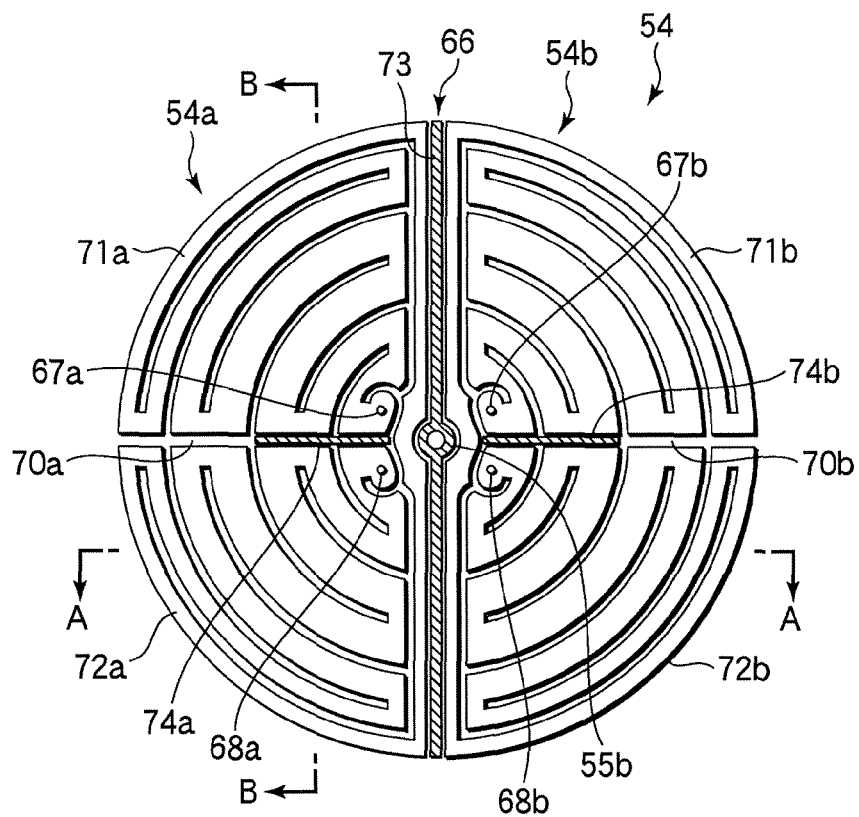
FIG. 3 is a plan view showing the structure of a heating element used in the wafer supporting mechanism according to the embodiment of the present invention.

Next, a detailed explanation will be given of the heating element 54. FIG. 3 is a plan view showing an example of the heating element 54. The heating element 54 has an essentially circular shape, which is divided by a separating portion 66 into two semicircular zones, i.e., a first zone 54a and a second zone 54b. In the central area of the circular heating element 54, electric feeder terminals 67a and 68a for the first zone 54a and electric feeder terminals 67b and 68b for the second zone 54b are disposed, so that the first zone 54a and second zone 54b are supplied with electricity independently of each other. The first zone 54a includes a first pattern 71a and a second pattern 72a, which are respectively formed on both sides of a boundary portion 70a extending perpendicularly to the separating portion 66, and are connected to each other in the central area of the heating element 54. The second zone 54b also includes a first pattern 71b and a second pattern 72b, which are respectively formed on both sides of a boundary portion 70b extending perpendicularly to the separating portion 66, and are connected to each other in the central area of the heating element 54. The patterns of the heating element 54 are mazy as a whole, so that the SiC heating element becomes dense to attain high thermal uniformity. Further, gaps are formed between adjacent portions of the heating element 54 to isolate them from each other. The heating pattern is determined appropriately in light of necessary thermal uniformity, and thus is not limited to a specific one. Accordingly, the heating pattern may be formed of another pattern, such as a rectangular patter, as long as it can provide necessary thermal uniformity. Further, electrically insulating members made of, e.g., quartz may be interposed between adjacent portions of the heating element 54.

Figure 4:
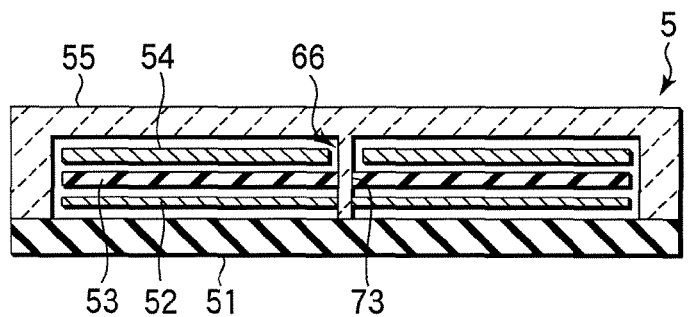
FIG. 4 is a sectional view showing a portion of the worktable taken along a line A-A in FIG. 3.

The separating portion 66 includes a quartz partition plate 73 for separating the first zone 54a and second zone 54b of the heating element 54 proximally present to each other. The partition plate 73 is formed on the bottom of the cover 55 and extending downward, as shown in FIG. 4, which is a sectional view showing a portion of the worktable 5 taken along a line A-A in FIG. 3. As shown in FIG. 3, the partition plate 73 extends on both sides of the thermo couple receptor 55b. The lower end of the partition plate 73 reaches the base member 51, so that the partition plate 73 entirely covers the opposed faces of the first zone 54a and second zone 54b extending in the radial direction. The partition plate 73 cuts off an electric field between the first zone 54a and second zone 54b to prevent electric discharge from occurring at this portion, almost completely.

Figure 5:
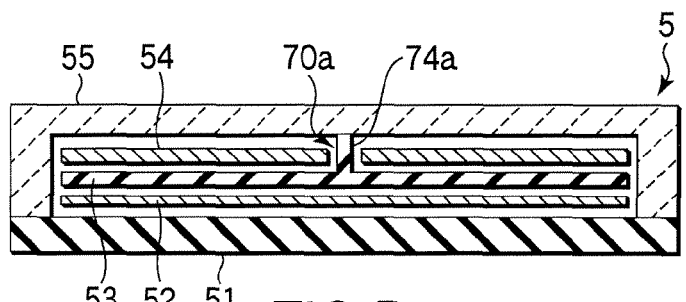
FIG. 5 is a sectional view showing a portion of the worktable taken along a line B-B in FIG. 3.

The boundary portions 70a and 70b respectively include quartz partition plates 74a and 74b at positions in and near the central area. The partition plates 74a and 74b are formed on the upper surface of the insulating plate 53 and extending upward, as shown in FIG. 5, which is a sectional view showing a portion of the worktable 5 taken along a line B-B in FIG. 3. The partition plates 74a and 74b are used for preventing electric discharge from occurring between adjacent portions of the heating element 54 present on both side of the partition plates 74a and 74b. If no partition plates are disposed between these portions, electric discharge may easily occur, because the electric potential difference therebetween is large. On the other hand, adjacent portions of the heating element 54 are also present at the peripheries of the boundary portions 70a and 70b, but the electric potential difference therebetween is small. Accordingly, electric discharge can hardly occur therebetween, and thus there is no need to use partition plates. However, in light of higher safety, partition plates may be used for these portions.

Next, an explanation will be given of an operation of the plasma processing apparatus 100 having the structure described above.

At first, a wafer W is loaded into the chamber 1 and placed on the worktable 5. Then, electricity is supplied to the heating element 54 of the worktable 5 from the power supply section 43 through the wiring lines 44 and electric feeder electrodes 61, so that the wafer W on the worktable 5 is heated to a predetermined temperature. Then, predetermined gases are supplied at predetermined flow rates from the gas supply unit 16 through the gas feed ports 15a into the chamber 1. The gases supplied at this time are selected from various gases in accordance with the process, and, for example, they are a rare gas, such as Ar, Kr, or He, and an oxide gas such as $O_2$, $N_2O$, NO, $NO_2$, or $CO_2$, or a nitride gas such as $N_2$ or $NH_3$.

Then, microwaves are supplied from the microwave generation unit 39 through the matching circuit 38 into the wave guide tube 37. The microwaves are guided through the rectangular wave guide tube 37b, mode transducer 40, and coaxial wave guide tube 37a in this order, and are then propagated through the inner conductive body 41 to the planar antenna member 31. Then, the microwaves are radiated from the slots of the planar antenna member 31 through the transmission plate 28 into the chamber 1. When the microwaves are radiated into the chamber 1, an electro magnetic field is thereby formed inside the chamber 1 and turns the process gases into plasma. By use of microwave plasma thus formed, a predetermined vacuum process, such as a CVD film formation process, oxidation process, or nitridation process, is performed.

Since microwaves are radiated from a number of slot holes 32 of the planar antenna member 31, this plasma has a high plasma density of about $1 \times 10^{10}$ to $5 \times 10^{12}/cm^3$ and a low electron temperature of about 1.5 eV or less near the wafer W. Accordingly, where this plasma acts on the wafer W, the process can be performed while suppressing plasma damage.

According to this embodiment, since the heating element 54 is made of SiC, it is hardly damaged even at a high temperature. Further, since heat rays are reflected by the reflectors 52 and 56 and applied onto the substrate, the heating efficiency is improved.

However, where a plasma process is performed in a vacuum at a high temperature of about 800° C., the heating element 54 needs to be supplied with a very large electric current. Further, the heating element 54 is densely disposed to attain high process uniformity, while the interior of the chamber 1 is set in a vacuum state. Consequently, if no countermeasures are taken, electric discharge may occur due to a large electric potential difference caused between portions of the heating element 54 adjacent to each other, typically between the first zone 54*a* and second zone 54*b* having distinct electric feed pathways. Further, although it is no so serious as compared to the problem caused between the first zone 54*a* and second zone 54*b* having distinct electric feed pathways, electric discharge may also occur even in the same zone due to a relatively large electric potential difference in the central area. Specifically, a relatively large electric potential difference is caused between adjacent portions of the first pattern 71*a* and second pattern 72*a* in the central area of the first zone 54*a*, and between adjacent portions of the first pattern 71*b* and second pattern 72*b* in the central area of the second zone 54*b*.

In this respect, according to this embodiment, the quartz partition plate 73 serving as an electrically insulating member is disposed in the separating portion 66 between the first zone 54*a* and second zone 54*b* having distinct electric feed pathways. Further, the partition plates 74*a* and 74*b* are respectively disposed between the first pattern 71*a* and second pattern 72*a* in the central area of the first zone 54*a*, and between adjacent portions of the first pattern 71*b* and second pattern 72*b* in the central area of the second zone 54*b*. These electrically insulating members respectively shield the portions apt to suffer electric discharge, so that the heating element 54 is effectively prevented from causing electric discharge. Consequently, it is possible to stably perform a vacuum process.

Particularly, the partition plate 73 is formed on the bottom of the cover 55 to extend therefrom into the gap between the first zone 54*a* and second zone 54*b* where electric discharge easily occurs. Consequently, it is possible to reliably prevent electric discharge from occurring between the first zone 54*a* and second zone 54*b* at the upper face of the heating element 54 which is influential on the wafer W.

The present invention is not limited to the embodiment described above, and it may be modified in various manners. For example, in the embodiment described above, the plasma processing apparatus is exemplified by the RLSA type, but the plasma processing apparatus may be of another type in which plasma is generated by electromagnetic waves, such as the remote plasma type, ICP type, ECR type, surface reflection wave type, or magnetron type. The type of the plasma process is not limited to a specific one, and it may be selected from various plasma processes, such as oxidation, nitridation, oxynitridation, film formation, etching, and heating processes. Further, the present invention may be applied to a process other than the plasma processes. Furthermore, in the embodiment described above, the target substrate is exemplified by a semiconductor wafer, which may be a silicon wafer or compound semiconductor wafer. In this respect, the target substrate is not limited to a semiconductor wafer, and it may be another substrate, such as a glass substrate for FPDs.

What is claimed is:

1. A substrate supporting mechanism including a function for heating a substrate placed thereon in a chamber of a substrate processing apparatus, the substrate supporting mechanism comprising:
   a worktable configured to place the substrate thereon and including a heating element made of silicon carbide and formed in a predetermined pattern;
   a support member connected to a central portion of a lower side of the worktable and supporting the worktable inside the chamber;
   electric feeder electrodes connected to the heating element from outside the chamber through the support member and configured to supply electricity to the heating element; and
   a partition member made of an electrically insulating material and interposed between portions adjacent to each other in the heating element formed in the predetermined pattern,
   wherein the worktable includes a cover that covers at least an upper side of the heating element, a sheeting plate disposed below the heating element, and a base member disposed below the sheeting plate, each of the cover, the sheeting plate, and the base member being made of an electrically insulating material,
   the heating element includes first and second zones respectively forming their own electric feed pathways, which are electrically independent of each other,
   each of the first and second zones includes first and second patterned parts respectively forming their own sub-patterns, which are respectively provided with first and second terminals at their terminal ends disposed in a central area of the worktable and are electrically connected to each other at their connection ends opposite to the terminal ends, the first and second terminals leading to corresponding ones of the electric feeder electrodes,
   the partition member includes an inter-zone partition plate interposed between the first and second zones and an intra-zone partition plate interposed between the first and second patterned parts, to prevent electric discharge, such that the intra-zone partition plate has a central-area plate portion interposed between portions of the first and second patterned parts in the central area of the worktable to prevent electric discharge from occurring due to a large electric potential difference caused when an electric current flows between the first and second terminals,
   the inter-zone partition plate projects from a lower surface of the cover and extends to the base member, and
   the intra-zone partition plate projects from an upper surface of the sheeting plate and extends to the cover.

2. The substrate supporting mechanism according to claim 1, wherein the electric feeder electrodes are made of silicon carbide.

3. The substrate supporting mechanism according to claim 1, wherein the intra-zone partition plate includes no portion interposed between the first and second patterned parts radially outside the central-area plate portion.

4. The substrate supporting mechanism according to claim 1, wherein the first and second zones are semicircular zones separated from each other by the inter-zone partition plate radially extending at a center of the worktable, the first and second patterned parts are sector-form parts partitioned by the intra-zone partition plate radially extending at a center of each of the semicircular zones, and the sector-form parts respectively include the sub-patterns formed by repeatedly bending a line portion of the heating element from a central side of the worktable toward a peripheral side of the worktable.

5. The substrate supporting mechanism according to claim 1, wherein the first and second patterned parts respectively include portions defining the connection ends and extending along the inter-zone partition plate through a space between the inter-zone partition plate and the first and second terminals.

6. A substrate processing apparatus comprising:
a chamber configured to accommodate a substrate and sustain a vacuum therein;
a substrate supporting mechanism disposed inside the chamber and including a function for heating the substrate placed thereon; and
a process mechanism configured to perform a predetermined process on the substrate inside the chamber,
wherein the substrate supporting mechanism comprises
a worktable configured to place the substrate thereon and including a heating element made of silicon carbide and formed in a predetermined pattern,
a support member connected to a central portion of a lower side of the worktable and supporting the worktable inside the chamber,
electric feeder electrodes connected to the heating element from outside the chamber thorough the support member and configured to supply electricity to the heating element, and
a partition member made of an electrically insulating material and interposed between portions adjacent to each other in the heating element formed in the predetermined pattern,
wherein the worktable includes a cover that covers at least an upper side of the heating element, a sheeting plate disposed below the heating element, and a base member disposed below the sheeting plate, each of the cover, the sheeting plate, and the base member being made of an electrically insulating material,
the heating element includes first and second zones respectively forming their own electric feed pathways, which are electrically independent of each other,
each of the first and second zones includes first and second patterned parts respectively forming their own sub-patterns, which are respectively provided with first and second terminals at their terminal ends disposed in a central area of the worktable and are electrically connected to each other at their connection ends opposite to the terminal ends, the first and second terminals leading to corresponding ones of the electric feeder electrodes,
the partition member includes an inter-zone partition plate interposed between the first and second zones and an intra-zone partition plate interposed between the first and second patterned parts, to prevent electric discharge, such that the intra-zone partition plate has a central-area plate portion interposed between portions of the first and second patterned parts in the central area of the worktable to prevent electric discharge from occurring due to a large electric potential difference caused when an electric current flows between the first and second terminals,
the inter-zone partition plate projects from a lower surface of the cover and extends to the base member, and
the intra-zone partition plate projects from an upper surface of the sheeting plate and extends to the cover.

7. The substrate processing apparatus according to claim 6, wherein the process mechanism includes a function for using electromagnetic waves to generate plasma, thereby performing a plasma process on the substrate.

8. The substrate processing apparatus according to claim 7, wherein the plasma process is performed by use of microwave plasma.

9. The substrate processing apparatus according to claim 6, wherein the first and second zones are semicircular zones separated from each other by the inter-zone partition plate radially extending at a center of the worktable, the first and second patterned parts are sector-form parts partitioned by the intra-zone partition plate radially extending at a center of each of the semicircular zones, and the sector-form parts respectively include the sub-patterns formed by repeatedly bending a line portion of the heating element from a central side of the worktable toward a peripheral side of the worktable.

10. The substrate processing apparatus according to claim 6, wherein the first and second patterned parts respectively include portions defining the connection ends and extending along the inter-zone partition plate through a space between the inter-zone partition plate and the first and second terminals.

11. The substrate processing apparatus according to claim 6, wherein the electric feeder electrodes are made of silicon carbide.

12. The substrate processing apparatus according to claim 6, wherein the intra-zone partition plate includes no portion interposed between the first and second patterned parts radially outside the central-area plate portion.

* * * * *